US012702062B2

(12) United States Patent
Vergis et al.

(10) Patent No.: US 12,702,062 B2
(45) Date of Patent: Aug. 4, 2026

(54) MEMORY ON PACKAGE (MOP) WITH REVERSE CAMM (COMPRESSION ATTACHED MEMORY MODULE) AND CMT CONNECTOR

(71) Applicant: Intel Corporation, Santa Clara, CA (US)

(72) Inventors: George Vergis, Portland, OR (US); Min Suet Lim, Gelugor (MY); Luis Carlos Alvarez Mata, Cartago (CR); Ankita Tiwari, Sunnyvale, CA (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 17/902,740

(22) Filed: Sep. 2, 2022

(65) Prior Publication Data

US 2023/0005882 A1 Jan. 5, 2023

(51) Int. Cl.
H10W 90/00 (2026.01)
H01R 12/71 (2011.01)
(Continued)

(52) U.S. Cl.
CPC .......... H10W 90/00 (2026.01); H01R 12/714 (2013.01); H01R 13/2435 (2013.01);
(Continued)

(58) Field of Classification Search
CPC .................................................. H01L 25/0652
(Continued)

(56) References Cited

U.S. PATENT DOCUMENTS 6,241,531 B1 6/2001 Roath et al.
6,354,844 B1 3/2002 Coico et al.
(Continued)

FOREIGN PATENT DOCUMENTS

CN 101452324 B 6/2009
CN 109683077 A 4/2019
(Continued)

OTHER PUBLICATIONS

Dell's DDR5 CAMM Appears in More Detail_ TheLostSwede_ Apr. 1-15, 2022.
(Continued)

*Primary Examiner* — Ajay Arora
(74) *Attorney, Agent, or Firm* — Compass IP Law PC

(57) ABSTRACT

Memory on Package (MOP) apparatus with reverse CAMM (Compression Attached Memory Module) and compression mount technology (CMT) connector(s). The MOP includes a first (MOP) substrate to which one or more CPUs, SoC, and XPUs that is operatively coupled to one or more CAMMs with a CMT connector(s) disposed between an array of CMT contact pads on the CAMM substrate and an array of CMT contact pad on the substrate. The one or more CAMMs are include multiple memory chips or packages such as LP DDR chips or DDR (S)DRAM chips/packages mounted to an underside of the CAMM substrate via signal coupling means such as a ball grid array (BGA), where the CAMM orientation is inverted such that the memory chips/ packages are disposed downward, resulting in a reduced Z-height of the MOP. A MOP may include two CAMMs with a respective CMT connector disposed between the CAMM substrates and the MOP substrate.

13 Claims, 9 Drawing Sheets

(51) Int. Cl.

| | |
|---|---|
| *H01R 13/24* | (2006.01) |
| *H10W 40/60* | (2026.01) |
| *H10W 72/00* | (2026.01) |

(52) U.S. Cl.
CPC ......... *H10W 40/613* (2026.01); *H10W 72/00* (2026.01); *H10W 40/60* (2026.01)

(58) Field of Classification Search
USPC .......................................................... 257/790
See application file for complete search history.

(56) References Cited

U.S. PATENT DOCUMENTS

| | | | |
|---|---|---|---|
| 7,427,809 | B2 | 9/2008 | Salmon |
| 8,094,455 | B2 | 1/2012 | Hong-Chi |
| 8,282,402 | B2 | 10/2012 | Ngo |
| 8,690,589 | B2 | 4/2014 | Ngo |
| 9,536,593 | B1 * | 1/2017 | Peterson ........ H03K 19/018521 |
| 9,575,519 | B2 | 2/2017 | Yin et al. |
| 11,074,952 | B1 | 7/2021 | Schnell et al. |
| 11,321,009 | B2 | 5/2022 | Schnell et al. |
| 11,394,141 | B2 | 7/2022 | Schnell et al. |
| 12,349,274 | B2 | 7/2025 | Rao et al. |
| 2003/0231476 | A1 | 12/2003 | Vinson et al. |
| 2005/0245105 | A1 | 11/2005 | Driscoll et al. |
| 2008/0254657 | A1 | 10/2008 | Sun et al. |
| 2011/0151701 | A1 | 6/2011 | Ngo |
| 2013/0005190 | A1 | 1/2013 | Blanchfield et al. |
| 2013/0039016 | A1 | 2/2013 | Wu et al. |
| 2013/0055192 | A1 | 2/2013 | Colbert et al. |
| 2013/0094167 | A1 | 4/2013 | Chen et al. |
| 2015/0171535 | A1 | 6/2015 | Li et al. |
| 2016/0056560 | A1 * | 2/2016 | Farkas ................... H01R 43/00 29/842 |
| 2016/0170928 | A1 | 6/2016 | Tamarkin et al. |
| 2017/0069369 | A1 | 3/2017 | Kim et al. |
| 2017/0286353 | A1 | 10/2017 | Tamarkin et al. |
| 2019/0051641 | A1 | 2/2019 | Lee et al. |
| 2019/0052008 | A1 | 2/2019 | Consoli et al. |
| 2019/0114109 | A1 * | 4/2019 | Arora ................... G06F 1/3275 |
| 2019/0206827 | A1 | 7/2019 | Eskandar |
| 2020/0019519 | A1 | 1/2020 | Johnson et al. |
| 2020/0388598 | A1 * | 12/2020 | Azeroual ................ H01L 25/50 |
| 2021/0321516 | A1 | 10/2021 | Rao et al. |
| 2021/0349144 | A1 | 11/2021 | Zhang |
| 2021/0374056 | A1 | 12/2021 | Malladi et al. |
| 2021/0408704 | A1 | 12/2021 | Li et al. |
| 2022/0027078 | A1 | 1/2022 | Schnell et al. |
| 2022/0028848 | A1 | 1/2022 | Baek |
| 2022/0344309 | A1 | 10/2022 | Schnell et al. |
| 2022/0360002 | A1 | 11/2022 | Li et al. |
| 2022/0361328 | A1 | 11/2022 | Li et al. |
| 2022/0394853 | A1 | 12/2022 | Shi et al. |
| 2023/0007775 | A1 | 1/2023 | Li et al. |
| 2023/0120513 | A1 | 4/2023 | Kong et al. |
| 2023/0353151 | A1 | 11/2023 | Lee et al. |
| 2024/0364037 | A1 | 10/2024 | Hanks et al. |

FOREIGN PATENT DOCUMENTS

| | | |
|---|---|---|
| CN | 113059811 A | 7/2021 |
| JP | 3208606 B2 | 9/2001 |
| WO | 9616532 A1 | 5/1996 |

OTHER PUBLICATIONS

Extended European Search Report for Patent Application No. 23170057.6, Mailed Oct. 31, 2023, 8 pages.

First Office Action for U.S. Appl. No. 17/354,540, Mailed Aug. 13, 2024, 16 pages.

First Office Action for U.S. Appl. No. 17/871,542, Mailed Aug. 6, 2025, 29 pages.

Intel compression mount technology—An overview-_Underfox_ Dec. 1-10, 2024.

Notice of Allowance for U.S. Appl. No. 17/354,540, Mailed Mar. 24, 2025, 8 pages.

Final Office Action for U.S. Appl. No. 17/871,686, Mailed Nov. 12, 2025, 23 pages.

First Office Action for U.S. Appl. No. 17/871,611, Mailed Oct. 1, 2025, 12 pages.

Restriction Requirement for U.S. Appl. No. 17/971,442, Mailed Dec. 23, 2025, 6 pages.

* cited by examiner

MEMORY ON PACKAGE (MOP) WITH REVERSE CAMM (COMPRESSION ATTACHED MEMORY MODULE) AND CMT CONNECTOR

BACKGROUND INFORMATION

Memory on Package (MOP) architecture provides high memory speeds and low power for thin and light mobile market segments, such a mobile devices, laptops, notebooks, etc. Under one conventional MOP approach, DRAM (Dynamic Random Access Memory) chips are mounted onto the topside of the package, side by side with a CPU (Central Processing Unit) and/or System on Chip (SoC) die. A drawback of this approach is that the DRAM chips (or module carrying the DRAM chips) are permanently coupled to the package. As a result, the memory cannot be upgraded (e.g., add more memory or replace with faster memory) or cannot be replaced upon failure.

Some other conventional approaches for memory included in laptops and notebooks includes having memory modules, such as Dual Inline Memory Modules (DIMMs) or Small Outline DIMMs (SO-DIMMs) that are coupled to a system board or the like via an edge connector. Some problems with these architectures include signal degradation at higher frequencies and bandwidths, and increased stack height (also referred to as Z-height). To accommodate the increased Z-height, the laptop, notebook, or other thin profile computing devices housing must be increased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2a shows a plan view of a platform assembly including a DDR CAMM;

FIG. 2b shows a cross-section view of the platform assembly of FIG. 2a;

DETAILED DESCRIPTION

Figures 1A, 1B:
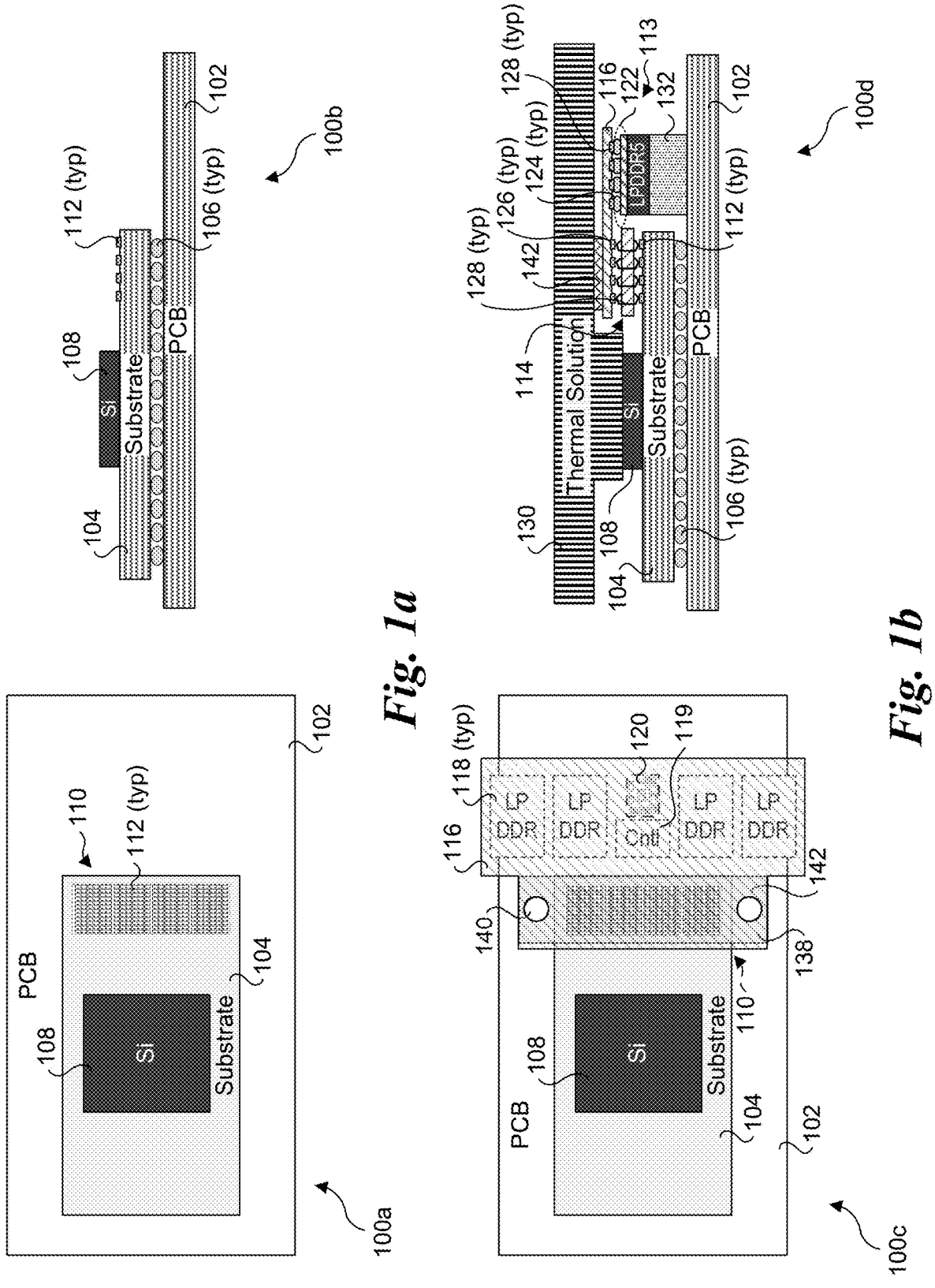
FIG. 1a shows a plan view and a cross-section view of a platform PCB and substrate before assembly with an LP CAMM, according to one embodiment.
FIG. 1b shows a plan view and a cross-section view of an assembled platform including an LP CAMM, according to one embodiment.

Embodiments of Memory on Package (MOP) apparatus with reverse CAMM (Compression Attached Memory Module) and compression mount technology (CMT) connector(s) are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments disclosed herein, MOP package architectures with CAMMs are provide where the orientation of the CAMMs are reversed (e.g., inverted) relative to conventional package architectures. This results in the DRAM chips and other circuitry facing a platform's system board or other printed circuit board (PCB). The embodiments also provide mechanical elements for stress support and thermal solutions for dissipating heat generated by the package components.

Figure 1D:
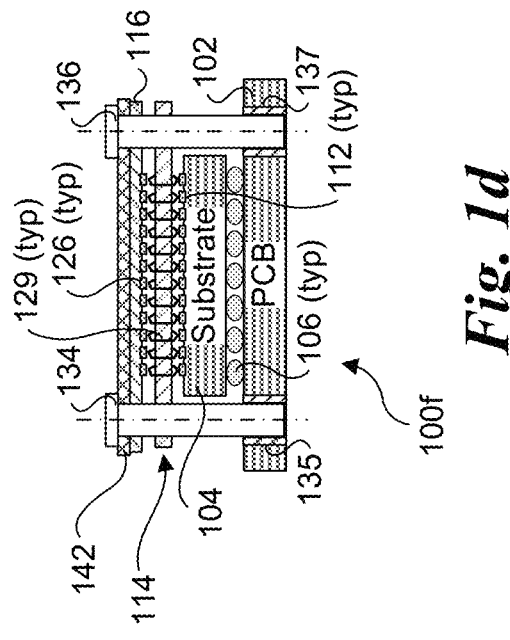
FIG. 1d shows an end cross-section view of an assembled platform of FIG. 1b including a pair of fasteners.
Figure 1C:
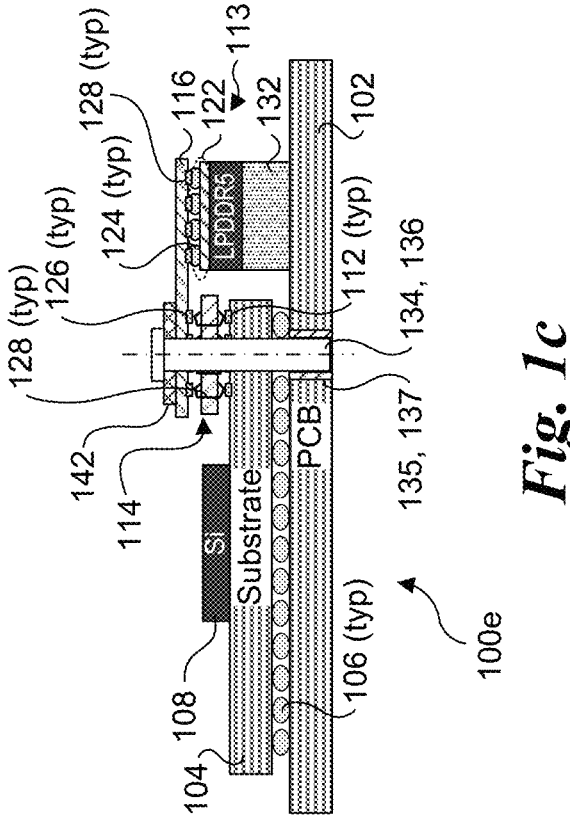
FIG. 1c shows a side cross-section view of the assembled platform of FIG. 1b including a pair of fasteners.

FIG. 1a shows before assembly views 100a and 100b while FIGS. 1b, 1c, and 1d show assembly views 100c, 100d, 100e and 100f of a first embodiment of a platform including a MOP package with a reversed or inverted low power (LP) memory CAMM, where views 100a and 100c are plan views and views 110b, 100d, 100e, and 100f are cross-section views. It is noted that the views are illustrative and not drawn to scale, and that the relative thickness dimensions for some of the components in the cross-section views herein are exaggerated for clarity and point of illustration. One having skill in the art will recognize the components in an actual implementation will generally have thicknesses that are different than that shown in the Figures herein (e.g., substantially thinner).

The platform includes a printed circuit board (PCB) 102 to which a substrate 104 is mounted via a Ball Grid Array (BGA) including solder balls 106. Substrate 104 may be mounted to PCB 102 via other means, such as but not limited to a Pin Grid Array (PGA) or Land Grid Array (LGA). In one embodiment, PCB 102 is a motherboard or system board. A silicon (Si) chip or package 108 is mounted to substrate 104, such as via a BGA (not shown) or via a socketed connection. For example, in some embodiments Si chip 108 is a central processing unit (CPU) or System on a Chip (SoC) with a BGA comprising an array of solder balls on its underside that are electrically coupled to a matching array of solder pads and/or vias on PCB 102 using a surface mount technique. In the case of a socketed connection, Si chip 108 would include an array of pins comprising a PGA that are inserted into a socket with a matching array of receiving members, such as a Zero Insertion Force (ZIF) connector. LGA sockets may also be used. In addition to CPU and/or SoCs, the Si chips illustrated herein may comprise a so-called other processing unit (XPU), which are discussed below.

One or more arrays 110 of CMT contact pads 112 are formed on the top surface of substrate 104. Individual contact CMT contact pads 112 are coupled to pads or pin for Si chip 108 via wiring in the substrate (not separately shown). Generally, the number and configuration of CMT contact pads 112 in array 110 may vary to support a given implementation, and groups of contacts pads may comprise separate arrays that may be used for separate memory channels. For illustrative purposes, the array(s) are depicted as including 4 columns of contact pads in the cross-section views of FIGS. 1*b* and 1*c* and 12 rows in the cross-section view of FIG. 1*d*; however, it will be recognized that these simplified views are merely representative and non-limiting. The size and pitch of the CMT contact pads may also vary, as well as the number of arrays.

As shown in the assembled views 100*c* and 100*d* of FIG. 1*b*, the assembly further includes an LP memory CAMM 113 that is electrically coupled to CMT pads 112 in array 110 via a CMT connector 114 and substrate 116. LP memory CAMM 113 includes a plurality of LP memory chips or packages 118 (hereinafter "chips" refers to both chips and packages) and a memory controller chip 119 mounted to substrate 116, as well as other chips and circuitry such as a voltage regulation (VR) circuitry 120. LP memory chips 118 and the other chips and circuitry are disposed on the underside of board 116 in the cross-section view 100*d* in FIG. 1*b*. In the illustrated embodiment, LP memory chips are LPDDR5 memory chips comprising a package including an integrated BGA 122 with an array of solder balls 124.

Substrate 116 includes an array of CMT contact pads 126 that are coupled to BGA pads 128 via "wiring" embedded in the substrate. As used herein, "wiring" includes any means of providing conductive pathways in the substrate to connect circuitry, which may include applicable layers and vias that are not separately shown but will be understood by those skilled in the art to be present in the substrates illustrated and discussed herein. The array of CMT contact pads 126 and array 110 of contact pads 112 have matching patterns, wherein pairs of contact pads in the two arrays are electrically coupled via respective spring-loaded contacts 129 in CMT connector 114. Further details of example embodiments of CMT connectors are shown in FIGS. 4*a*-4*e*. BGA 122 in coupled to the array of BGA pads 128 via solder balls 124.

As shown in cross-section view 100*d*, the assembled platform also includes components for removing heat, as collectively depicted by a thermal solution 130 and a thermal gasket and gap filler 132. Thermal solution 130 is generically illustrative of various types of thermal devices, including passive thermal devices such as heatsinks and active thermal devices such as liquid-cooled thermal devices. Thermal gasket and gap filler 132 also provides structural integrity for the assembly.

As shown in the side and end cross-section views 100*e* and 100*f* in FIGS. 1*c* and 1*d*, in one embodiment a pair of fasteners 134 and 136 are used to secure substrate 116 to PCB 102 while simultaneously loading contacts 129 in CMT connector 114 in compression contact with CMT contact pads 112 and 126. As shown in view 100*c* of FIG. 1*b*, a pair of holes 138 and 140 are formed in substrate 116 having a diameter to fit the shoulder diameter of fasteners 134 and 136. In one embodiment, fasteners 134 and 136 are screws that are threaded into threaded inserts 135 and 137 in PCB 102, such as Keenserts® or the like. Other types of fasteners may also be used. In the illustrated embodiment, and optional bolster plate 142 is used to enhance the structural integrity of the CMT connector assembly. Bolster plate 142 also includes holes that align with holes 138 and 140. Likewise, in some embodiments the body of CMT connector 114 also has holes that align with holes 138 and 140. In another embodiment (not shown), threaded inserts are inserted into substrate 104 rather than PCB 102.

Figures 2A, 2B:
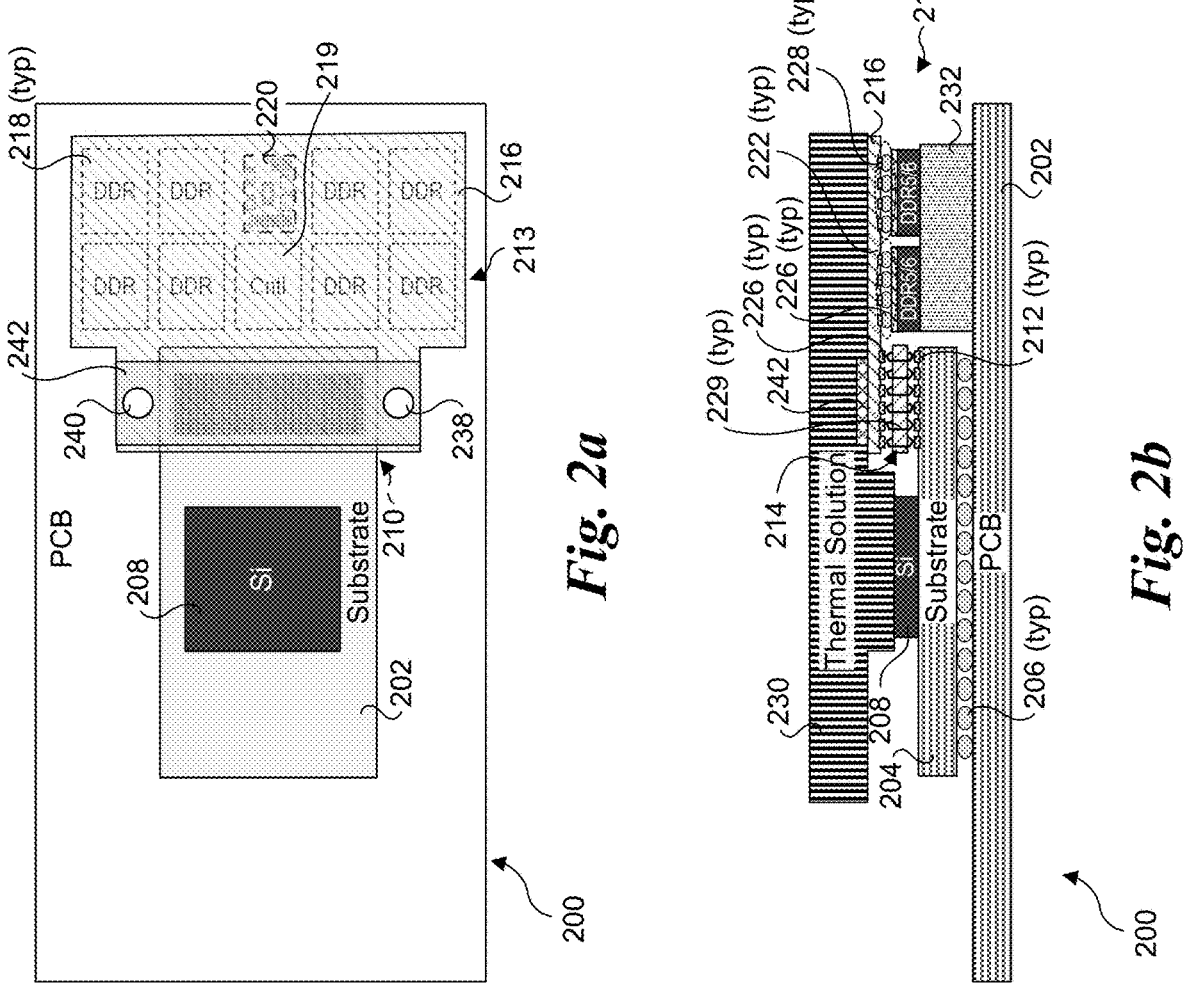

FIGS. 2*a* and 2*b* show plan and cross-section views of a platform 200 including a including a pair of DDR (Double Data Rate) memory CAMMs. Platform 200 includes a printed circuit board (PCB) 202 to which a substrate 204 is mounted via a BGA including solder balls 206. In one embodiment, PCB 202 is a motherboard or system board. An Si chip or package 208 is mounted to substrate 204, such as via a BGA or via a socketed connection (e.g., using a PGA or LGA) (not shown). For example, in some embodiments Si chip 208 is a central processing unit (CPU) or System on a Chip (SoC) having an array of solder balls in a BGA on its underside that are electrically coupled to a matching array of solder pads and/or vias on PCB 202 using a surface mount technique. In the case of a socketed connection, Si chip 208 would include an array of pins comprising a PGA on its underside that are inserted into a socket with a matching array of receiving members, such as a ZIF connector. As above, the Si chip 208 may also comprise an XPU.

One or more arrays 210 of CMT contact pads 212 are formed on the top surface of substrate 204. Individual contact CMT contact pads 212 are coupled to pads or pin for Si chip 208 via wiring in the substrate (not separately shown). The number and configuration of CMT contact pads 212 in array 210 may vary to support a given implementation. For illustrative purposes, a simplified array including 6 columns of CMT contact pad 212 is shown in FIG. 2*b*. As before, the number, size, and pitch of the CMT contact pads may vary to support a given implementation, as well as multiple arrays to support multiple memory channels.

Platform 200 further includes a DDR memory CAMMs 213 that is electrically coupled to CMT pads 212 in array 210 via a CMT connector 214 and a substrate 216. DDR memory CAMM 213 includes a plurality of DDR memory chips 218 mounted to substrate 216 via BGAs 222, as well as other chips and circuitry such as a controller chip 219 and VR circuitry 220. DDR memory chips 218, and the other chips and circuitry are disposed on the underside of board 216, as shown in the cross-section view in FIG. 2*b*.

Substrate 216 includes one or more arrays of CMT contact pads 226 electrical coupled to arrays of BGA pads 228 via wiring in the substrate (not shown) The one or more arrays of CMT contact pads 226 and one or more arrays 210 of CMT contact pads 212 have matching patterns, wherein pairs of CMT contact pads in the arrays are electrically coupled via respective spring-loaded contacts or pins 229 in CMT connector 214. A pair of holes 238 and 240 are formed in substrate 216.

Platform 200 also includes components for removing heat, as collectively depicted by a thermal solution 230 and a thermal gasket and gap filler 232. As before, thermal solution 230 is generically illustrative of various types of thermal devices, including passive thermal devices such as heatsinks and active thermal devices such as liquid-cooled thermal devices.

Generally, substrate 216 may be secured to substrate 204 (with CMT connector 214 sandwiched therebetween) via a pair of fasteners in a manner similar to those illustrated in FIGS. 1*c* and 1*d* and discussed above. In the illustrated embodiment, platform 200 includes a bolster plate 242 having a configuration similar to bolster plate 142.

Figures 3A, 3B:
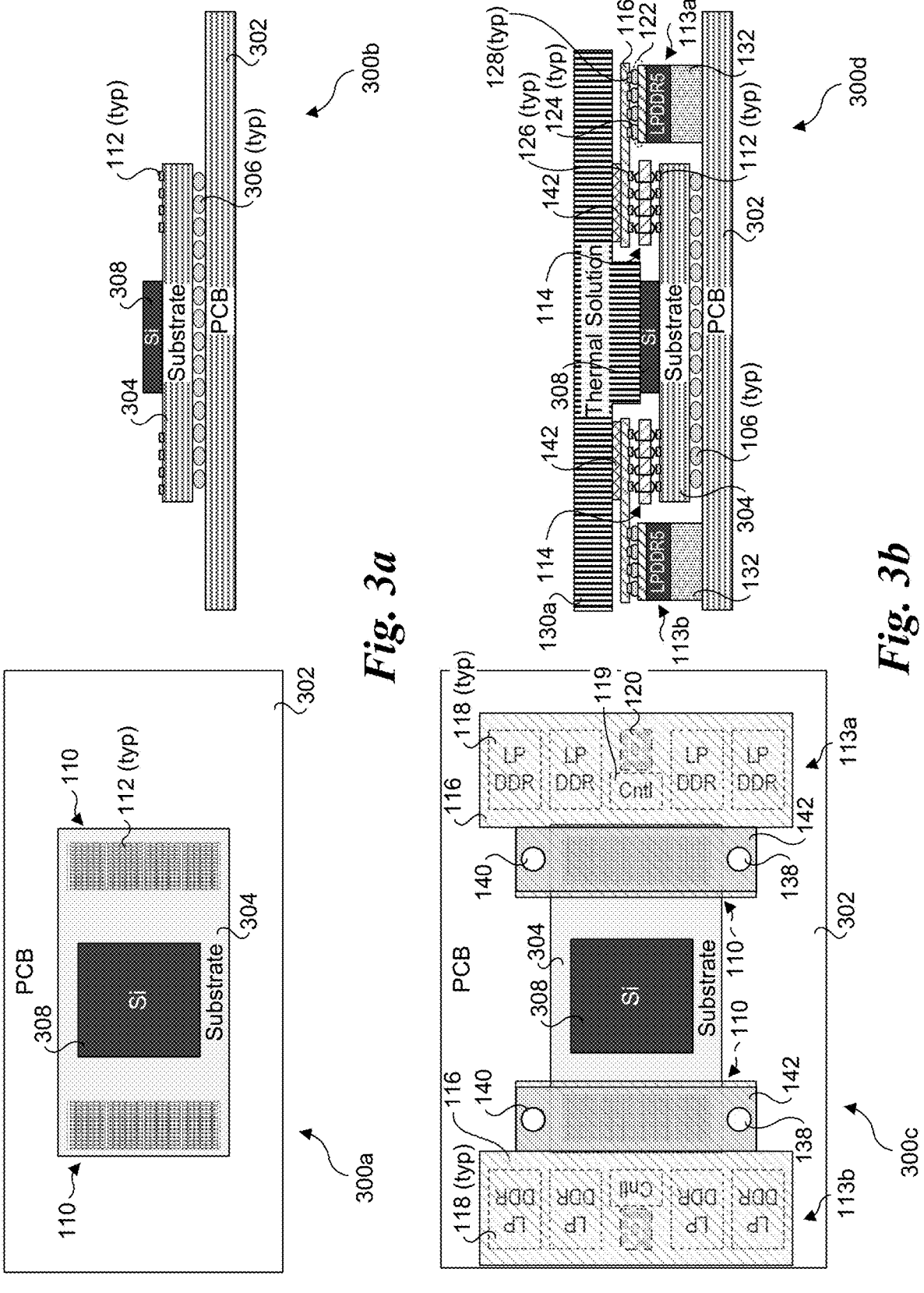
FIG. 3a shows a plan view and a cross-section view of a platform PCB and substrate before assembly with a pair of LP CAMM, according to one embodiment.
FIG. 3b shows a plan view and a cross-section view of an assembled platform including an LP CAMM.

FIGS. 3*a* and 3*b* show before assembly views 300*a* and 300*b* and after assembly views 300*c* and 300*d* of a third embodiment of a platform including a pair of inverted LP memory CAMMs. Generally, components in FIGS. 1*a*, 1*b*, 3*a*, and 3*b* with like-numbered references are the same or similar and have similar configurations and functions in both embodiments.

As shown in FIG. 3*a*, the platform includes a PCB 302 to which a substrate 304 is mounted via a BGA including solder balls 306. Substrate 304 includes arrays 110 of CMT pads 112 disposed on opposing sides of Si chip 308. As shown in FIG. 3*b* there are two instances for each of substrate 116, CMT connector 114, and bolster plate 142 having configurations similar to like-numbered components illustrated in FIGS. 1*a*, 1*b*, 1*c* and 1*d*. The platform in FIGS. 3*a* and 3*b* also includes two LP CAMMs 113*a* and 113*b* having a configuration similar to LP CAMM 113 in FIGS. 1*a*, 1*b*, 1*c*, and 1*d*. The platform also includes a thermal solution 130*a* and two instances of a thermal gasket and gap filler 132. In addition to performing thermal dissipation, thermal gasket and gap filler 132 also provides structure integrity to the MOP package.

Figures 4A, 4B, 4C:
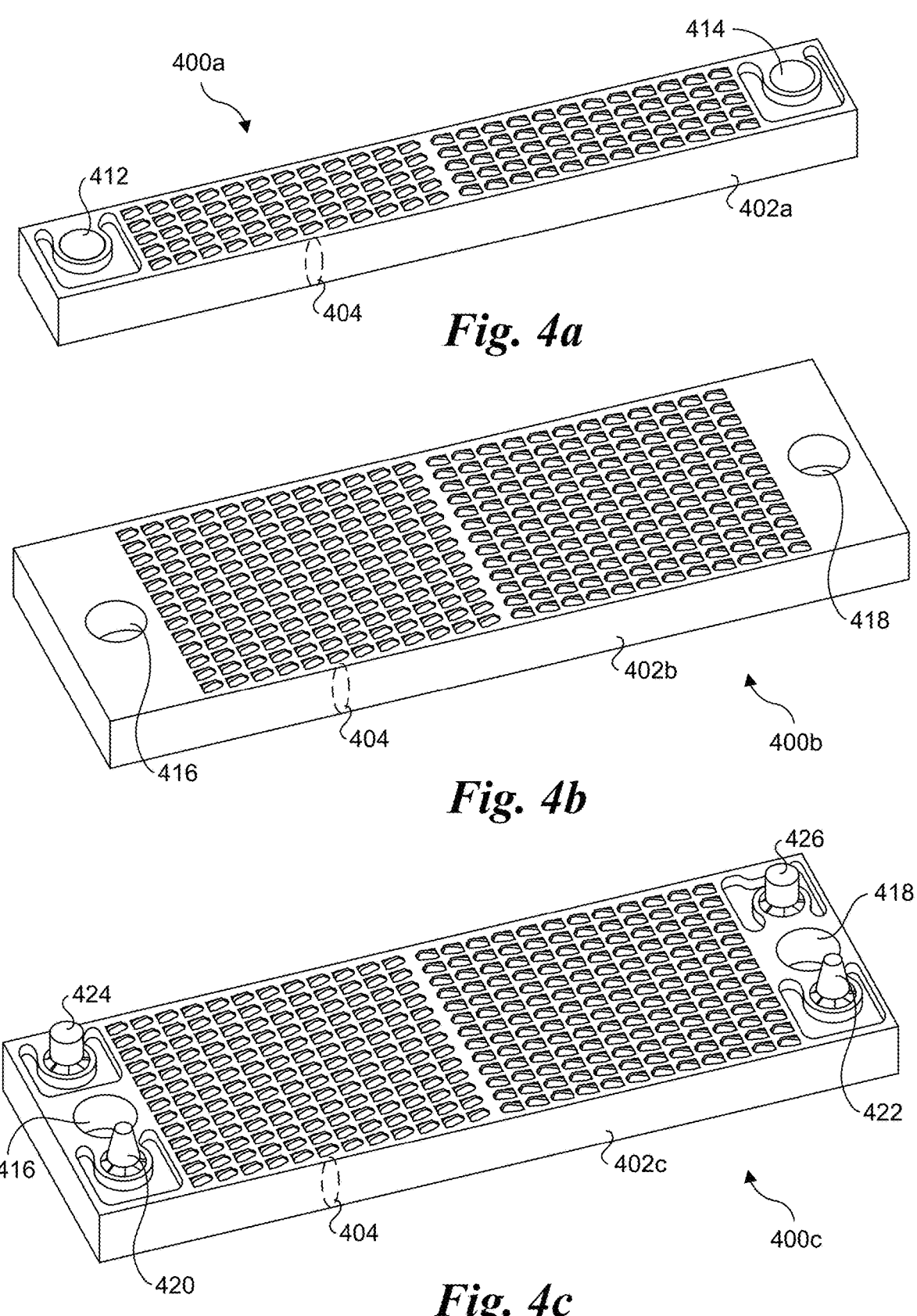
FIG. 4a shows a 3D view of a CMT connector, according to a first embodiment.
FIG. 4b shows a 3D view of a CMT connector, according to second embodiment.
FIG. 4c shows a 3D view of a CMT connector, according to a third embodiment.
Figure 4D:
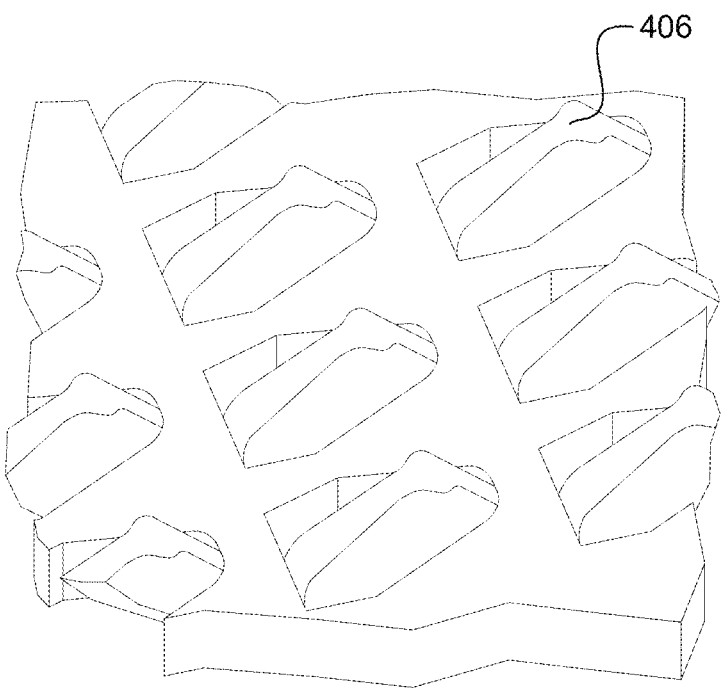
FIG. 4d shows a close-up view of the top of the spring contact structure used for the CMT pins.
Figure 4E:
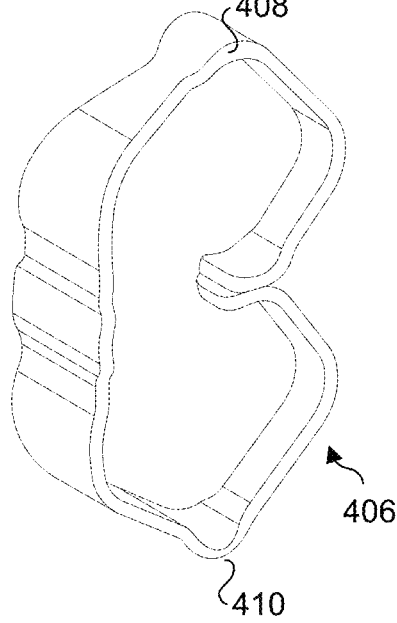
FIG. 4e shows a 3D view of a spring contact used for the CMT pins, according to one embodiment.

FIGS. 4*a*, 4*b*, and 4*c* show three-dimensional (3D) views of CMT connector 400*a*, 400*b*, and 400*c*, according to respective embodiments. CMT connectors 400*a*, 400*b*, and 400*c* are generally illustrative of the CMT connectors 114 and 214 described and illustrated above and includes a body 402 (402*a*, 402*b*, and 402*c*) in which arrays of spring-loaded CMT pins or contacts 404 are installed. CMT connector 400*b* shows an example of a CMT connector with a larger number of spring-loaded CMT pins or contacts 404. As shown in FIGS. 4*d* and 4*e*, in one embodiment the spring-loaded CMT pins include a pair of spring contacts 406 that are installed in opposing ends of tubes (not shown) that are compressed when CMT connector 400*a* (or 400*b* or 400*c*) is installed in a platform such as illustrated in the foregoing platform embodiments. As shown in FIG. 4*e*, a spring contact 406 comprises a bent structure made of a suitable metal and includes a pair of lobes 408 and 410; when two spring contacts 406 are installed in a tube and the components in the platform in FIGS. 1*a*, 1*b*, and 1*c* are installed, lobe 408 will contact a CMT contact pad 126 on substrate

116 while lobe 410 will contact a contact pad 112 in an array 110 of CMT contact pads on substrate 104. The tubes are disposed in respective holes in body 402.

Under an alternative configuration, a CMT connector may employ spring-loaded contacts 129 that comprise a single member made of a suitable metal. The spring-loaded contacts may be embedded in the body of a CMT connector when formed, or inserted into suitable holes or apertures formed in the CMT connector body during a separate manufacturing operation.

As shown in FIG. 4*a*, CMT connector 400*a* further includes a pair of holes 412 and 414, which are sized to fit the diameter of the shoulders of fasteners used in the assemblies. This is used to align the CMT connector pins/contacts with corresponding CMT contact pads on the substrate and interposer. Similarly, CMT connector 400*b* in FIG. 4*b* includes a pair of holes 416 and 418.

In some installations, it may be advantageous to include separate guide pins and/or dowels to align the CMT connector pins/contacts with corresponding CMT contact pads on the substrate and interposer. An example of this is shown for CMT connector 400*c* in FIG. 4*c*, which includes guide pins 420, 422, and dowels 424, and 426. When guide pins and/or dowels are used, the guide pins and fasteners may also be used for alignment purpose (such as two guide pins and two fasteners).

Figure 5:
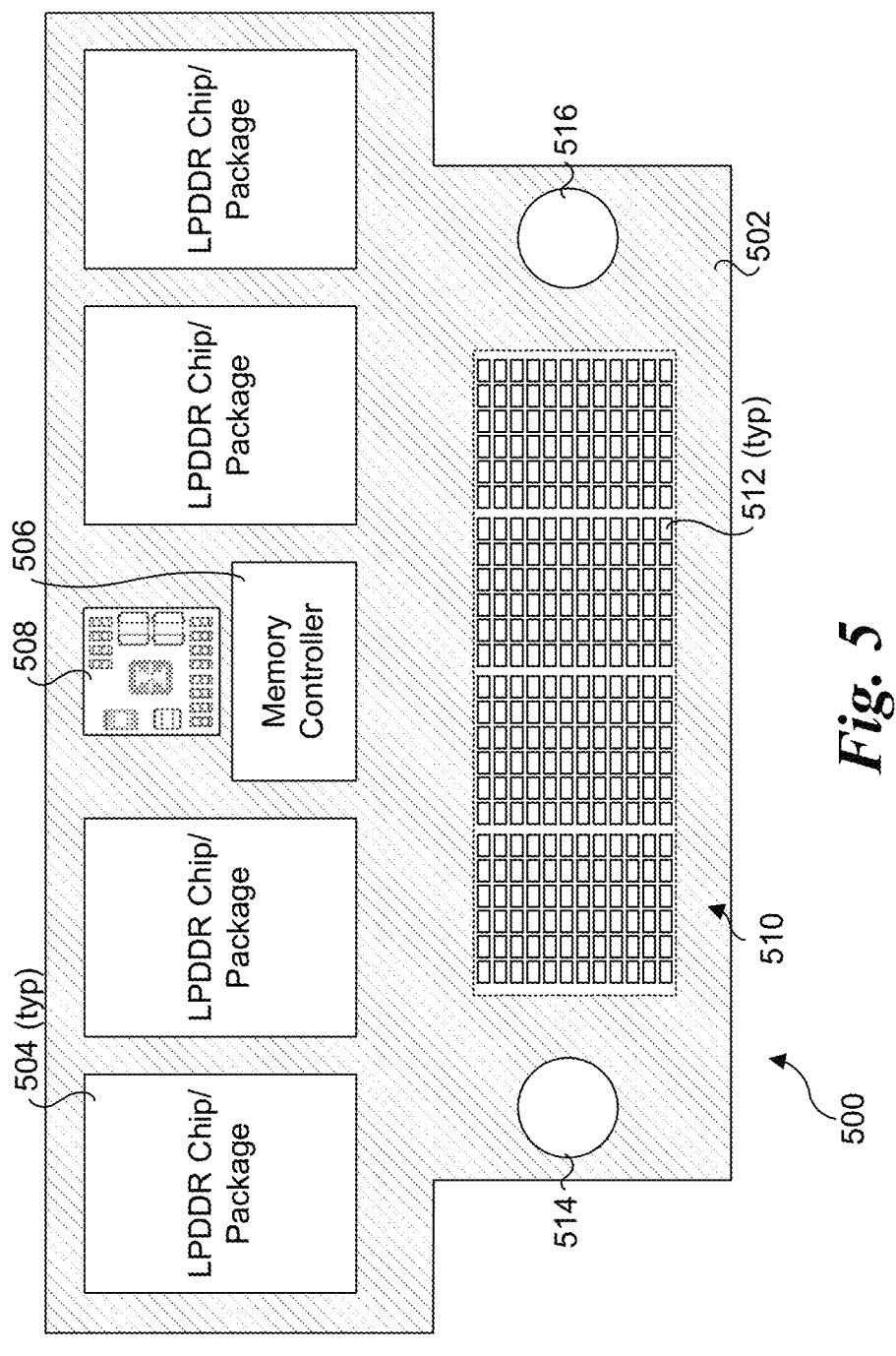
FIG. 5 shows an example of an LP memory CAMM, according to one embodiment.

FIG. 5 shows a plan view of a LP memory CAMM 500, according to one embodiment. LP memory CAMM 500 includes a substrate 502 to which multiple chips or package are mounted, as illustrated by LPDDR chips or packages 504 and a memory controller 506. LP memory CAMM 500 also includes VR circuitry 508, as well as other circuitry and components (not shown). One or more arrays 510 of CMT contract pads 512 are formed toward the bottom of substrate 502. When chips or packages are mounted to substrate 502 using BGAs, arrays of BGA pads will be disposed on the surface of substrate 502, with wiring embedded in the substrate used to couple CMT contact pads to BGA pads. When chips/packages are mounted to substrate 502 using other means, such as PGAs, LGAs, or other signal coupling mechanisms, applicable wiring will be used to couple CMT contact pads to pins or contacts or the like used by those other means.

In the embodiment illustrated in FIG. 5, a pair of holes 514 and 516 are formed in substrate 502. In other embodiments, additional holes (not shown) may be employed for alignment purposes, such as when alignment pins and/or dowels are used.

In the embodiment illustrate in FIG. 5, four LPDDR chips or packages 504 are shown. However, this is merely exemplary and non-limiting, as an LP memory CAMM may employ various numbers and combinations of LPDDR chips/packages. In one embodiment, LPDDR chips or packages 504 comprises LPDDR5 chips or packages, while other LPDDR chips or packages may likewise be used.

For embodiments of CAMMs that include onboard VR circuitry, a portion of CMT contact pads 512 will be wired to one or more voltage inputs of the VR circuitry. Other CMT contact pads may be coupled to a ground plane or other ground circuitry in substrate 502 and/or may provide a ground input to the onboard VR circuitry. In other embodiments not illustrated herein, a platform may include a memory VR module or the like that is configured to provide ground and voltage input(s) to a CAMM that does not include onboard VR circuitry. Under these embodiments, a portion of CMT contact pads 512 will be wired to provide one or more voltage inputs and ground to the chips or packages on the CAMM.

Figures 6A, 6B:
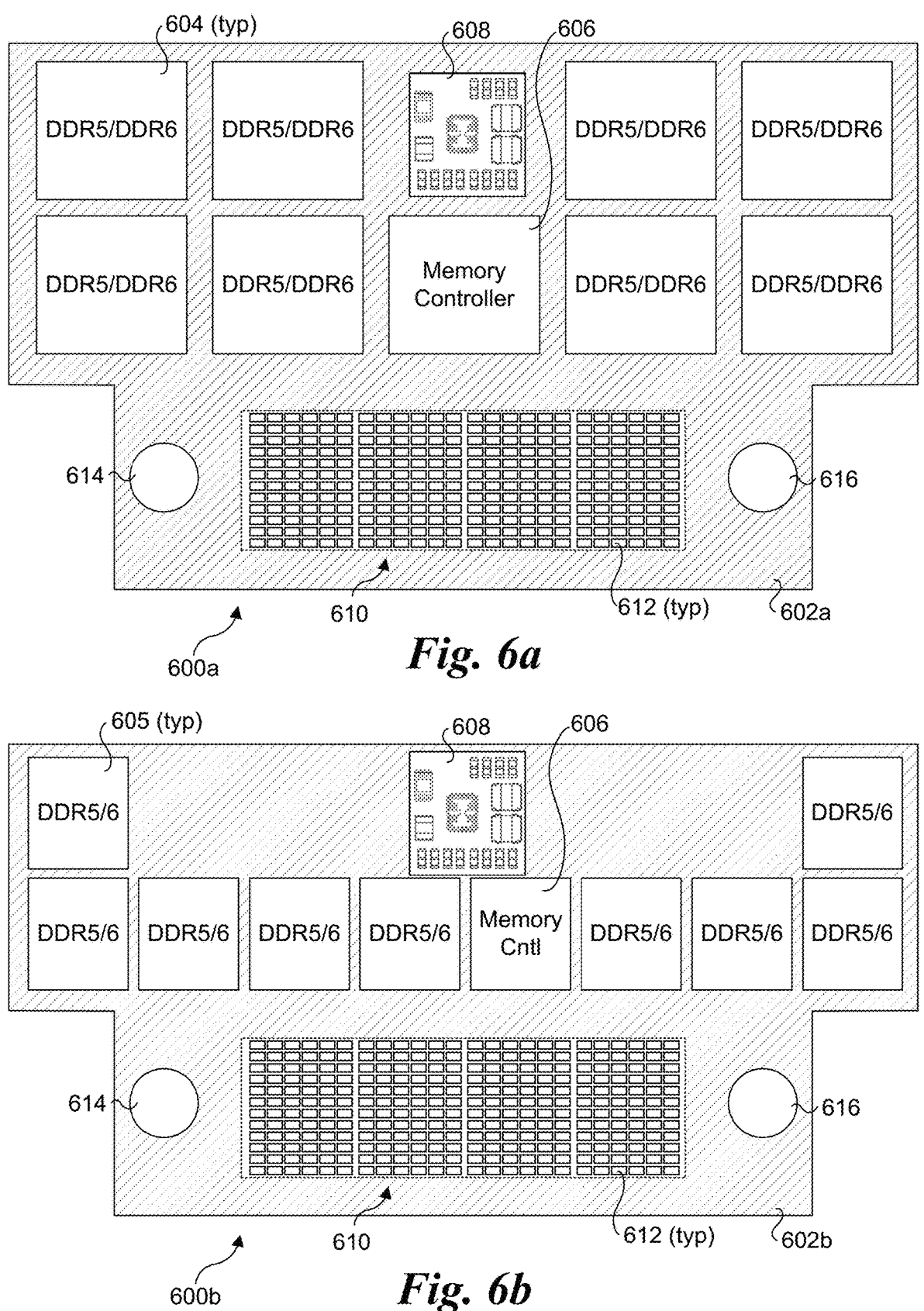
FIG. 6a shows a first example of an DDR memory CAMM, according to one embodiment.
FIG. 6b shows a second example of an DDR memory CAMM, according to a one embodiment.

FIGS. 6a and 6b show two examples of DDR memory CAMMs 600a and 600b employing different combinations of DDR memory chips. DDR memory CAMM 600a includes a substrate 602a to which multiple chips or package are mounted, as illustrated by DDR5/DDR6 chips or packages 604 and a memory controller 606. DDR memory CAMM 600a also includes VR circuitry 608, as well as other circuitry and components (not shown). One or more arrays 610 of CMT contract pads 612 are formed toward the bottom of substrate 602a. In addition, a pair of holes 614 and 616 are formed in substrate 602a.

When chips or packages are mounted to substrate 602a using BGAs, arrays of BGA pads will be disposed on the surface of substrate 602a, with wiring embedded in the substrate used to couple CMT contact pads to BGA pads. When chips/packages are mounted to substrate 602a using other means, such as PGAs, LGAs, or other signal coupling mechanisms, applicable wiring will be used to couple CMT contact pads to pins or contacts or the like used by those other means.

DDR memory CAMM 600b is similar to DDR memory CAMM 600a, except that a different combination and size of DDR5/DDR6 chips or packages are used, as depicted by DDR5/DDR6 chips 605 mounted to a substrate 602b. As depicted by like reference number in the two embodiments, the other components and circuitry for DDR memory CAMM 600b and DDR memory CAMM 600a are the same or similar. Generally, the memory capacity and/or size of the DDR memory chips may vary, as well as the outline of the substrate. In addition, the number of memory channels that are supported may vary from one or more channels. For example, a given implementation may support a single memory channel, two memory channels, four memory channels, etc. Generally, a separate array of CMT contact pads may be employed for each memory channel; from a physical implementation perspective, the arrays of CMT contact pads may have a slight separate in some embodiments, while in other embodiments the multiple arrays of CMT contact pads may appear as a single large array of CMT contact pads.

Figure 7:
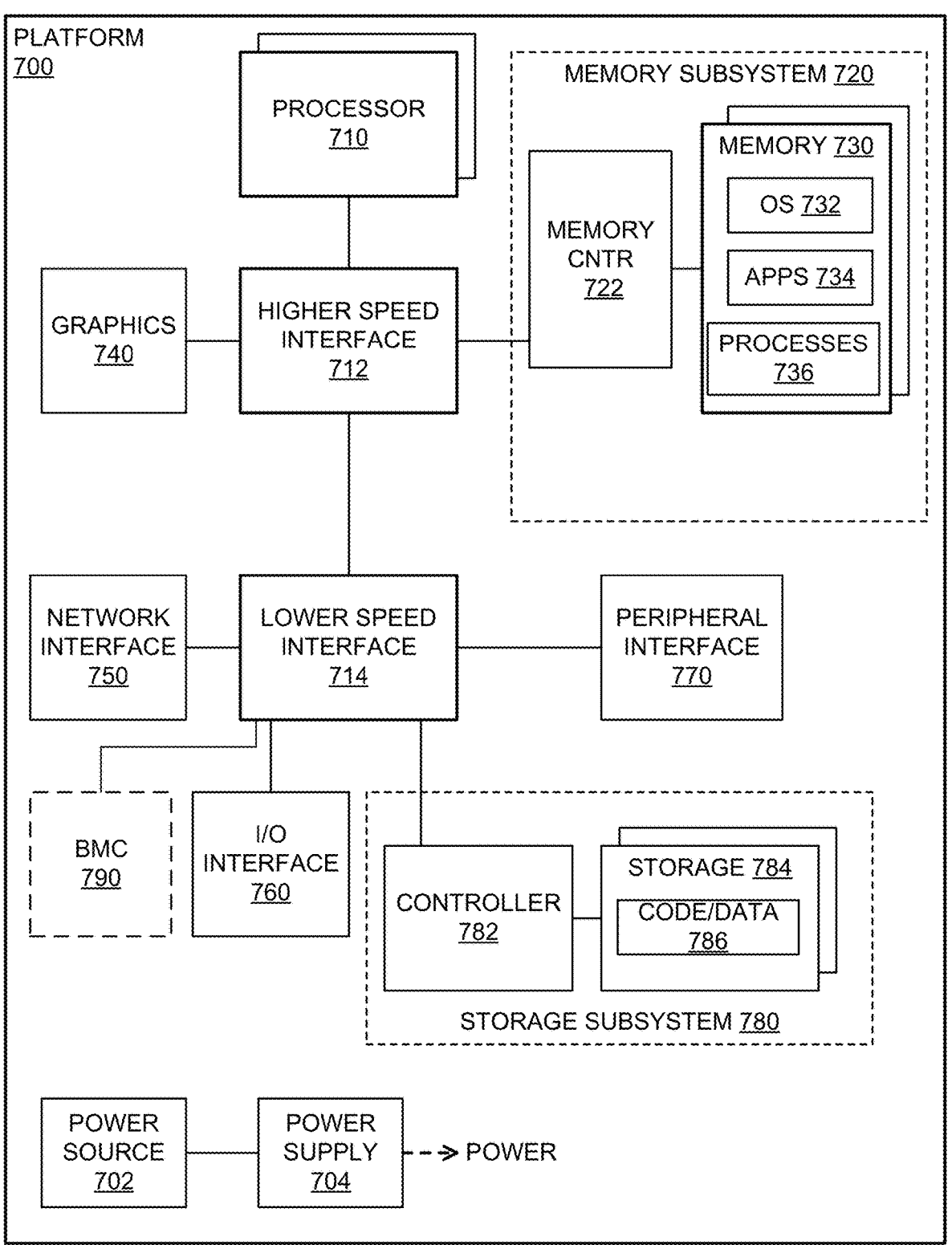
FIG. 7 shows a block diagram of an exemplary compute platform in which embodiments described and illustrated herein may be implemented.

FIG. 7 illustrates an example compute platform 700 in which aspects of the embodiments may be practiced. Compute platform 700 represents a computing device or computing system in accordance with any example described herein, and can be a server, laptop computer, desktop computer, or the like. More generally, compute platform 700 is representative of any type of computing device or system employing one or more AICs.

Compute platform 700 includes a processor 710, which provides processing, operation management, and execution of instructions for compute platform 700. Processor 710 can include any type of microprocessor, central processing unit (CPU), graphics processing unit (GPU), processing core, or other processing hardware to provide processing for compute platform 700, or a combination of processors. Processor 710 controls the overall operation of compute platform 700, and can be or include, one or more programmable general-purpose or special-purpose microprocessors, digital signal processors (DSPs), programmable controllers, application specific integrated circuits (ASIC s), programmable logic devices (PLDs), or the like, or a combination of such devices.

In one example, compute platform 700 includes interface 712 coupled to processor 710, which can represent a higher speed interface or a high throughput interface for system components that needs higher bandwidth connections, such as memory subsystem 720 or graphics interface components 740. Interface 712 represents an interface circuit, which can be a standalone component or integrated onto a processor die. Where present, graphics interface 740 interfaces to graphics components for providing a visual display to a user of compute platform 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touch-screen display. In one example, graphics interface 740 generates a display based on data stored in memory 730 or based on operations executed by processor 710 or both.

Memory subsystem 720 represents the main memory of compute platform 700 and provides storage for code to be executed by processor 710, or data values to be used in executing a routine. Memory 730 of memory subsystem 720 may include one or more memory devices such as DRAM DIMMs, read-only memory (ROM), flash memory, or other memory devices, or a combination of such devices. Memory 730 stores and hosts, among other things, operating system (OS) 732 to provide a software platform for execution of instructions in compute platform 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for compute platform 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that compute platform 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper-Transport or industry standard architecture (ISA) bus, a small computer system interface (SCSI) bus, a universal serial bus (USB), or an Institute of Electrical and Electronics Engineers (IEEE) standard 1394 bus.

In one example, compute platform 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides compute platform 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, compute platform 700 includes one or more I/O interface(s) 760. I/O interface(s) 760 can include one or more interface components through which a user interacts with compute platform 700 (e.g., audio, alphanumeric, tactile/touch, or other interfacing). Peripheral interface 770 can include any hardware interface not specifically mentioned above. Peripherals refer generally to devices that connect dependently to compute platform 700. A dependent connection is one where compute platform 700 provides the software platform or hardware platform or both on which operation executes, and with which a user interacts.

In one example, compute platform 700 includes storage subsystem 780 to store data in a nonvolatile manner. In one example, in certain system implementations, at least certain components of storage subsystem 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage device(s) 784 holds code or instructions and data 786 in a persistent state (i.e., the value is retained despite interruption of power to compute platform 700). A portion of the code or instructions may comprise platform firmware that is executed on processor 710. Storage device(s) 784 can be generically considered to be a "memory," although memory 730 is typically the executing or operating memory to provide instructions to processor 710. Whereas storage device(s) 784 is nonvolatile, memory 730 can include volatile memory (i.e., the value or state of the data is indeterminate if power is interrupted to compute platform 700). In one example, storage subsystem 780 includes controller 782 to interface with storage device(s) 784. In one example controller 782 is a physical part of interface 714 or processor 710 or can include circuits or logic in both processor 710 and interface 714. In one example, a storage device 784 may comprise an AIC such as an NVMe SSD that is mounted to the motherboard using a CMT connector using the assemble architecture shows in the Figures herein and discussed above.

Compute platform 700 may include an optional Baseboard Management Controller (BMC) 790 that is configured to effect the operations and logic corresponding to the flowcharts disclosed herein. BMC 790 may include a micro-controller or other type of processing element such as a processor core, engine or micro-engine, that is used to execute instructions to effect functionality performed by the BMC. Optionally, another management component (standalone or comprising embedded logic that is part of another component) may be used.

Power source 702 provides power to the components of compute platform 700. More specifically, power source 702 typically interfaces to one or multiple power supplies 704 in compute platform 700 to provide power to the components of compute platform 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 can include an internal battery or fuel cell source.

Various types of memory may be used in the LP memory and DDR memory CAMMs described and illustrated herein, including standardized memory devices (e.g., chips and/or packages). Such standards include DDR4 (Double Data Rate version 4, initial specification published in September 2012 by JEDEC (Joint Electronic Device Engineering Council). DDR4E (DDR version 4), LPDDR3 (Low Power DDR version 3, JESD209-3B, August 2013 by JEDEC), LPDDR4 (LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013), DDR5 (DDR version 5, JESD79-5A, published October, 2021), DDR version 6 (currently under draft development), LPDDR5, HBM2E, HBM3, and HBM-PIM, or others or combinations of memory technologies, and technologies based on derivatives or extensions of such specifications. The JEDEC standards are available at www.jedec.org.

As discussed above, in some embodiment the Si chips illustrated herein may comprise Other Processing Units (collectively termed XPUs). Examples of XPUs include one or more of Graphic Processor Units (GPUs) or General Purpose GPUs (GP-GPUs), Tensor Processing Units (TPUs), Data Processing Units (DPUs), Infrastructure Processing Units (IPUs), Artificial Intelligence (AI) processors or AI inference units and/or other accelerators, FPGAs and/or other programmable logic (used for compute purposes), etc. While some of the diagrams herein show the use of CPUs, this is merely exemplary and non-limiting. Generally, any type of XPU may be used in place of a CPU in the illustrated embodiments. Moreover, as used in the following claims, the term "processor" is used to generically cover CPUs and various forms of XPUs.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A memory on package (MOP), comprising:
a first substrate having one or more of a Central Processing Unit (CPU), System on a Chip (SoC) and other processing unit (XPU) mounted to a topside thereof and including one or more first arrays of compression mount technology (CMT) contacts pads disposed on the topside having and means for coupling signals for at least one or the CPU, SoC, and XPU to the one or more first arrays of CMT contact pads;
a Compression Attached Memory Module (CAMM) comprising,
a second substrate including a one or more second arrays of compression mount technology (CMT) contact pads disposed on a first side, plurality of first signal coupling arrays comprising first arrays of signal coupling means disposed on the first side of the second substate and including wiring connecting CMT contact pads to signal coupling means in the plurality of first signal coupling arrays; and
multiple memory chips or packages, each comprising a second signal coupling array comprising a second array of signal coupling means, wherein the signal coupling means in the second signal coupling array for a given memory chip or package are coupled to signal coupling means in a respective first signal coupling array on the second substrate; and
a CMT connector disposed between the first substrate and the second substrate, wherein the CMT connector includes an array of spring-loaded contacts or pins in contact with CMT contact pads in the one or more first arrays and one or more second arrays of CMT contact pads.

2. The MOP of claim 1, wherein the one or more second signal coupling arrays comprise one or more ball grid arrays (BGAs).

3. The MOP of claim 1, wherein the plurality of memory chips includes Low Power (LP) Double Data Rate (DDR) memory chips.

4. The MOP of claim 1, wherein the plurality of memory chips includes Double Data Rate fifth generation (DDR5) or sixth generation (DDR6) memory chips.

5. The MOP of claim 1, wherein the CAMM includes multiple arrays of signal coupling elements for coupling signals for multiple memory channels.

6. The MOP of claim 1, wherein the CAMM comprises a first CAMM, and the CMT connector comprises a first CMT connector, and wherein the first substrate further comprises one or more third arrays of CMT contact pads disposed on its topside and means for coupling signals for at least one of the CPU, SoC, and XPU to the one or more third arrays of CMT contact pads, further comprising:
a second CAMM comprising,
a third substrate including a one or more fourth arrays of compression mount technology (CMT) contact pads disposed on a first side, a plurality of third signal coupling arrays comprising a third arrays of signal coupling means disposed on the first side and wiring connecting CMT contact pads to signal coupling means in the plurality of third signal coupling arrays; and
multiple memory chips or packages, each comprising a fourth signal coupling array comprising a fourth array of signal coupling means, wherein the signal coupling means in the fourth signal coupling array for a given memory chip or package are coupled to signal coupling means in a respective third signal coupling array on the third substrate; and
a second CMT connector disposed between the third substate of the second CAMM and the first substrate, wherein the second CMT connector includes an array of spring-loaded contacts or pins in contact with CMT contact pads in the one or more third arrays of CMT contact pads and one or more fourth arrays of CMT contact pads.

7. A platform, comprising:
a first substrate having one or more of a Central Processing Unit (CPU), System on a Chip (SoC), and other processing unit (XPU) mounted to a topside thereof and including one or more first arrays of compression mount technology (CMT) contacts pads disposed on the topside and means for coupling signals for at least one or the CPU, SoC, and XPU to the one or more first array of CMT contact pads;
a printed circuit board (PCB) to which the first substrate is coupled;
a Compression Attached Memory Module (CAMM) comprising, a second substrate including a one or more second arrays of compression mount technology (CMT) contact pads disposed on a first side, a plurality of arrays of Ball Grid Array (BGA) pads disposed on the first side, and wiring connecting CMT contact pads to BGA pads in the arrays of BGA pads; and multiple memory chips or packages, each comprising a BGA package coupled to a respective array of BGA pads on the second substate via a plurality of solder balls; and a CMT connector disposed between the first substrate and the second substrate, wherein the CMT connector includes an array of spring-loaded contacts or pins in contact with CMT contact pads in the one or more first arrays and one or more second arrays of CMT contact pads.

8. The platform of claim 7, further comprising a structural means disposed between the CAMM and the PCB to facilitate structure integrity.

9. The platform of claim 8, wherein the structural means includes a thermal gasket and gap filler material.

10. The platform of claim 8, further comprising a thermal dissipation means thermally coupled to a topside of a CPU, SoC, or XPU mounted to the first substrate.

11. The platform of claim 7, wherein the CAMM comprises a first CAMM, and the CMT connector comprises a first CMT connector, and wherein the first substrate further comprises a third array of CMT contact pads disposed on its topside and means for coupling signals for at least one or the CPU, SoC, and XPU to the third array of CMT contact pads, further comprising:

a second CAMM comprising, a third substrate including a one or more fourth arrays of compression mount technology (CMT) contact pads disposed on a first side, a plurality of arrays of Ball Grid Array (BGA) pads disposed on the first side, and wiring connecting CMT contact pads to BGA pads in the arrays of BGA pads; and multiple memory chips or packages, each comprising a BGA package coupled to a respective array of BGA pads on the third substate via a plurality of solder balls; and a second CMT connector disposed between the third substate of the second CAMM and the first substrate, wherein the second CMT connector includes an array of spring-loaded contacts or pins in contact with CMT contact pads in the one or more third arrays of CMT contact pads and one or more fourth arrays of CMT contact pads.

12. The platform of claim 8, further comprising a bolster plate disposed above the second substrate proximate to the one or more second arrays of CMT contact pads, and first and second fasteners, wherein the first and second fasteners are coupled one or the first substrate and the PCB and apply a downward force to the bolster plate to cause the CMT spring-loaded contacts or pins in the CMT connector to be compressed against CMT contact pads in the one or more first and one or more second arrays of CMT contact pads.

13. The platform of claim 8, wherein the plurality of memory chips or packages includes Low Power Double Data Rate (LPDDR), Double Data Rate fourth generation (DDR4), fifth generation (DDR5) or sixth generation (DDR6) memory chips or packages.

* * * * *